United States Patent [19]

Skotheim

[11] 4,105,470
[45] Aug. 8, 1978

[54] DYE-SENSITIZED SCHOTTKY BARRIER SOLAR CELLS

[75] Inventor: Terje A. Skotheim, Berkeley, Calif.

[73] Assignee: The United States Government as represented by the United States Department of Energy, Washington, D.C.

[21] Appl. No.: 802,399

[22] Filed: Jun. 1, 1977

[51] Int. Cl.² ............................................. H01L 31/06
[52] U.S. Cl. .......................... 136/89 SJ; 136/89 NB; 357/8; 357/15; 357/30
[58] Field of Search ....................... 136/89 NB, 89 SJ; 357/8, 30, 15; 250/211 J, 212

[56] References Cited

U.S. PATENT DOCUMENTS 3,935,031  1/1976  Adler ................................. 136/89 X

OTHER PUBLICATIONS

C. W. Tang et al., "Photovoltaic Effects of Metal–Chlorophyll-a-Metal Sandwich Cells", *J. Chem. Phys.*, vol. 62, pp. 2139–2149 (1975).

R. Memming, "Photochemical & Electrochemical Processes of Excited Dyes at Semiconductor & Metal Electrodes", *Photochem. Photobiol.*, vol. 16, pp. 325–333 (1972).

S. J. Dudkowski, "Sensitization of Photoconduction in a Zinc Oxide Film by Eosin", *J. Opt. Sci. Am.*, vol. 54, pp. 486–491 (1964).

H. Meier et al., "Zum Problem Der pn-Übergänge Zwischen Organischen und Anorganischen Photoleitern", *Ber. Bunsen Physik Chem.*, vol. 69, pp. 160–167 (1965).

*Primary Examiner*—Aaron Weisstuch
*Attorney, Agent, or Firm*—Dean E. Carlson; R. S. Gaither; Clifton E. Clouse, Jr.

[57] ABSTRACT

A low-cost dye-sensitized Schottky barrier solar cell comprised of a substrate of semiconductor with an ohmic contact on one face, a sensitizing dye adsorbed onto the opposite face of the semiconductor, a transparent thin-film layer of a reducing agent over the dye, and a thin-film layer of metal over the reducing agent. The ohmic contact and metal layer constitute electrodes for connection to an external circuit and one or the other or both are made transparent to permit light to penetrate to the dye and be absorbed therein for generating electric current. The semiconductor material chosen to be the substrate is one having a wide bandgap and which therefore is transparent; the dye selected is one having a ground state within the bandgap of the semiconductor to generate carriers in the semiconductor, and a first excited state above the conduction band edge of the semiconductor to readily conduct electrons from the dye to the semiconductor; the reducing agent selected is one having a ground state above the ground state of the sensitizer to provide a plentiful source of electrons to the dye during current generation and thereby enhance the generation; and the metal for the thin-film layer of metal is selected to have a Fermi level in the vicinity of or above the ground state of the reducing agent to thereby amply supply electrons to the reducing agent.

8 Claims, 3 Drawing Figures

DYE-SENSITIZED SCHOTTKY BARRIER SOLAR CELLS

BACKGROUND OF THE INVENTION

The invention disclosed herein was made under, or in, the course of U.S. Energy Research and Development Administration Contract No. W-7405-ENG-48 with the University of California.

The present invention relates to a low-cost solar cell of adequate efficiency, and more particularly it relates to a dye-sensitized Schottky barrier solar cell with a reducing agent applied over the dye.

A persistent problem in the use of solar cells for large scale production of electrical energy is to fabricate arrays of solar cells with which large currents can be produced at a useful voltage at a low enough cost and sufficiently high efficiency, reliability and stability to make them competitive with established forms of electrical energy production. One of the most efficient solar cells is made of gallium arsenide. Such cells have theoretical upper limits of efficiency of around 27% and efficiencies of 21% have been actually achieved. However, the cost of fabricating gallium arsenide cells is very high and the cells generally are unstable. Another, and one of the most popular types of solar cells, is made of silicon. These cells have efficiencies of 12 – 15%, are stable and are among the lowest cost cells available. However, the cost of silicon cells is still too high to permit their use to be sharply competitive with conventional forms of electrical energy production. In a silicon cell, impinging light produces electrical charges throughout the silicon. The charges then diffuse to the junction region of the cell to be collected. In order for this to occur, silicon of very high purity is required so that the electrons and positive holes have a long enough diffusion length to reach the junction without recombining. This requirement for purity leads to the high cost of a silicon cell. In addition, the relatively low efficiency of silicon cells, coupled with their expense, results in a large total cost of a silicon cell array because of the large number required.

Still another type of solar cell is the Schottky barrier cell for which costs are substantially less than for a silicon cell. In a Schottky barrier cell, impinging light produces electrical charges primarily in the junction region of the cell so that the charges do not need to diffuse over any significant length to be collected. With the diffusion process eliminated in the collection of charges in a Schottky barrier cell, material of much less purity and therefore of lower cost may be used. However, in the prior art, Schottky barrier cells have only a modest efficiency and produce only a modest amount of current. An improvement of efficiency in individual Schottky barrier cells or an improvement in the efficiency of arrays of such cells would make the cells more competitive with conventional electrical energy production because of their very low cost.

SUMMARY OF THE INVENTION

In brief, the present invention is a very low-cost sensitized Schottky barrier solar cell comprised of a substrate of semiconductor provided with an ohmic contact, a sensitizer layer on the surface of the substrate, a reducing agent over the sensitizer, and a layer of metal over the reducing agent. The semiconductor preferably is one having a wide bandgap, and the sensitizer is one having a ground state (highest filled orbital of the unexcited molecule) within the bandgap and a first excited state (lowest empty orbital of the unexcited molecule) above the conduction band edge of the semiconductor.

It is an object of the invention to provide efficient, low-cost solar cell arrays for the generation of electrical energy.

Another object is to provide a solar cell that is stable in the presence of heat and moisture over long periods of photocurrent generation.

Another object is to construct a Schottky barrier solar cell that is low in cost, efficient, reliable and stable.

Another object is to construct a solar cell array that produces high currents at a useful voltage.

Another object is to provide individual solar cells that may be packaged with a high density into arrays to maximize the efficiency of the arrays.

Other objects and advantageous features of the invention will be apparent in a description of a specific embodiment thereof, given by way of example only, to enable one skilled in the art to readily practice the invention, the embodiment being described hereinafter with reference to the accompanying drawing.

DESCRIPTION OF AN EMBODIMENT

Figure 1:
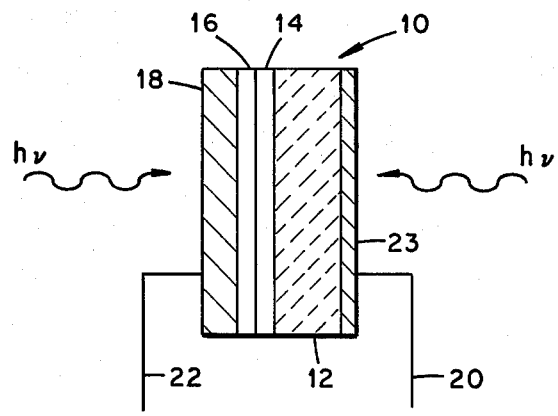
FIG. 1 is a cross-sectional view of the layers of a sensitized Schottky barrier solar cell, expanded in the horizontal direction for clarity of illustration, according to the invention.

Referring to the drawing there is shown in FIG. 1 a cross-sectional view of a Schottky barrier solar cell 10 including a substrate of semiconductor 12, a sensitizer layer 14, a reducing agent layer 16, and a metal layer 18. The cell also is provided with output leads 20 and 22 connected respectively to an ohmic contact 23 on the outer surface of the semiconductor 12 and the metal layer 18, for connection to external circuits. The metal layer 18 may be made so thin as to be transparent to light to permit the light to penetrate to the sensitizer layer and be absorbed therein. The semiconductor material selected should be doped and also should have a wide bandgap and thus be inherently transparent to all or most of the solar spectrum; the material selected for the sensitizer layer should have a ground state within the bandgap of the semiconductor and a first excited state above the upper conduction band edge of the semiconductor; the ohmic contact 23 may be in the form of a grid to thereby have a high degree of transparency or it may be a solid layer if transparency is not necessary; the material selected for the reducing agent layer should constitute a plentiful source of electrons at an energy level greater than the ground state of the sensitizer for conduction to the sensitizer layer; and the metal for the layer 18 should have a Fermi level in the vicinity of or above the ground state of the sensitizer layer material.

In fabrication of the solar cell 10, one face of the semiconductor 12 is immersed in a solution of solvent and the material of the sensitizer layer 14. The sensitizer material is adsorbed onto the immersed face of the semiconductor to form the layer 14. The reducing agent layer 16 is then evaporated onto the layer 14, the metal layer 18 is evaporated over the layer 16, the ohmic contact 23 is evaporated onto the other surface of the semiconductor and the leads 20 and 22 are attached to the ohmic contact 23 and metal layer 18. The layers 14 and 16 are made so thin as to permit a readjustment of charge to occur between the metal layer 18 and semiconductor 12. This results in band bending of the semiconductor and this effect is represented in the energy level diagram of FIG. 2 wherein the energy level bands of the semiconductor 12 are shown bent to higher energy levels in the vicinity of the metal layer 18.

Figure 2:
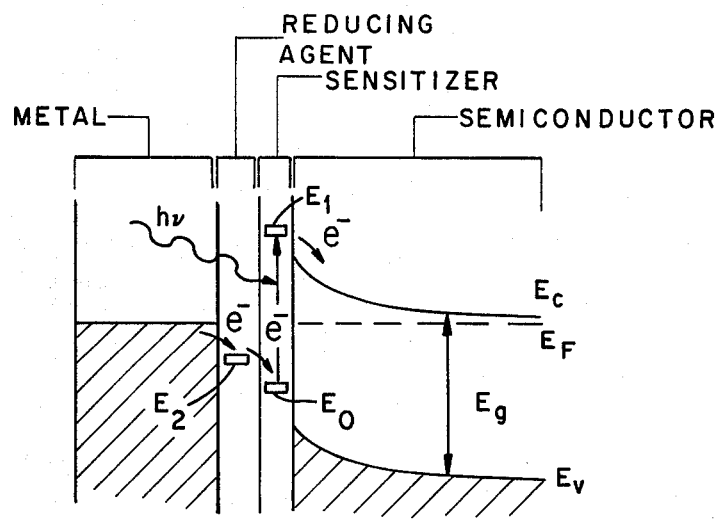
FIG 2 is an energy level diagram of the solar cell of FIG. 1.

The various energy levels depicted in FIG. 2 may be defined as follows:

$E_v$ is the valence energy level of the semiconductor 12;

$E_c$ is the conduction energy level of the semiconductor 12;

$E_g$ is the energy bandgap of the semiconductor 12 and its boundaries are defined by $E_c$ and $E_v$;

$E_F$ is the Fermi energy level of the metal layer 18;

$E_o$ is the ground state of the sensitizer layer 14;

$E_1$ is the first excited state of the sensitizer layer 14; and $E_2$ is the ground state of the reducing agent layer 16.

In operation of the cell 10, light quanta hv are directed onto the metal layer 18. Since the layer 18 and the reducing agent layer 16 may be made so thin as to be transparent to the light, the light penetrates to the sensitizer layer 14 and is absorbed therein, raising electrons in molecules of the sensitizer from the ground state $E_o$ which is within the bandgap $E_g$ of the semiconductor 12 to the first excited state $E_1$ which is above the conduction level $E_c$ of the semiconductor at its interface with the sensitizer. The excited electrons tunnel into the semiconductor, while electrons in the reducing agent, which is selected to have an abundance of electrons at an energy level $E_2$ that is greater than the ground state of the sensitizer, replenish the electrons in the sensitizer layer; and the electrons in the metal layer, most of which are at the Fermi level $E_F$, replenish those lost from the reducing agent. If a metal is selected with a Fermi level below $E_2$ (the ground state of the reducing agent), impinging sunlight may be used to heat the metal so that the metal electrons are raised to sufficiently high energy levels to conduct into the reducing agent. In either case, a photoelectric current is generated in the cell 10 for conduction to an external circuit that may be connected across the leads 20 and 22.

The semiconductor 12 may be selected, for example, from materials such as, but not limited to, titanium dioxide, zinc oxide or tin oxide which have bandgaps in the range of 3.2eV and therefore are transparent to all or most of the solar spectrum. The thickness of the semiconductor is not critical but should be thin to reduce cost consistent with desired ruggedness. The sensitizer layer 14 may be an organic dye such as, for example, the cyanine dyes of photographic dyes, and its thickness should range from 1 – 10 monolayers. The reducing agent (or oxidizing agent) layer 16 may be a material such as for example hydroquinone, allylthiourea or a leuco dye, with a thickness from 100 – 1000 angstrom units. The metal layer 18 may be one of the good conductors, for example, gold, silver, copper, lead and conveniently may also be one that is corrosion resistant to the environment in which it is to be used. The thickness of the layer 18 should be such that it is not resistive. The omhic contact 23 may be indium or a eutectic alloy of indium.

A specific embodiment of the invention was constructed by immersion of one face of a semiconductor crystal of titanium dioxide in a $3 \times 10^{-5}$ M solution of a thiacarbocyanine dye (3,3'-bis-sulfo-propyl 5,5'-dimethyl-9-ethylthiacarbocyanine), where the solvent was 30% dichloromethane and 70% carbon tetrachloride. The amount of absorbed dye was $2.5 \times 10^{-6}$ millimoles/cm$^2$ which is equivalent to about 10 monolayers. A layer of hydroquinone was evaporated on top of the dye to a depth of less than a micron, a transparent layer of gold was evaporated over the hydroquinone, and a layer of indium was evaporated over the other face of the semiconductor crystal. In tests of the resulting cell, a quantum efficiency of 6% was obtained. This was a sevenfold increase in efficiency over a similar cell fabricated without the hydroquinone layer. Also, the open circuit voltage was increased in the cell with the hydroquinone layer by a factor of about 40 over the cell without the hydroquinone layer.

Figure 3:
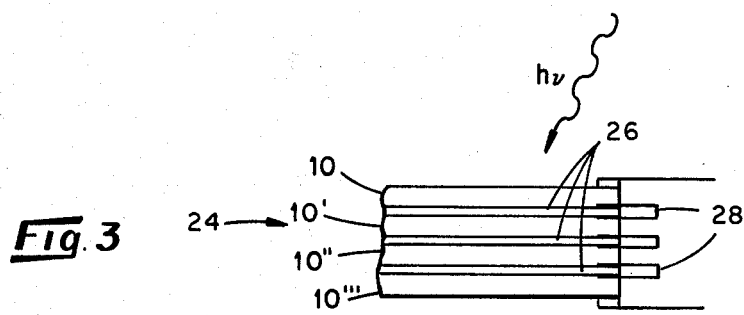
FIG. 3 is a side view of a layered stack of solar cells of FIG. 1, shown for clarity of illustration expanded in the veritcal dimension and cut in the horizontal direction, for extracting energy of impinging sunlight at the same or different wavelengths in successive layers of the stack.

Although the cell 10 has only a modest efficiency, it is very stable, reliable, and low in cost, and may be stacked with similar cells, 10', 10'' and 10''' in an array 24 (FIG. 3) to achieve high efficiencies, still at very low cost. The semiconductor 12 is inherently transparent and each of the layers 14, 16 and 18 may be made so thin as to be virtually transparent to sunlight except for the wavelengths at which the dye absorbs. By fabricating each of the cells in the array 24 with a dye that absorbs at different wavelengths, the sunlight not absorbed in the first cell 10 may be absorbed in the subsequent cells 10', 10'', and 10''' through which the sunlight passes. Transparent insulating spacers 26 may be provided between the cells for electric field isolation between the cells. Such spacers may be made from materials such as silicon dioxide or tantalum oxide inserted as chips or evaporated in layers. Leads 28 may be provided for electrically interconnecting the cells either in series or parallel (not shown). Thus, by stacking solar cells, a means is provided for extracting a substantially greater amount of solar energy per unit square of impinging light but it is still achieved at a very low cost because of the low cost of each cell. In addition, dyes may be mixed to increase the absorbed bandwidth of light in each cell.

The efficiency of each cell also may be increased by the use of an antireflective coating on the cell side of the metal layer 18. Such coating may be silicon dioxide or aluminum oxide and applied such as by evaporation.

The efficiency of a single cell 10 also may be increased and its cost reduced by forming the semiconductor 12 from powdered crystals, such as microcrystals of titanium dioxide or zinc oxide having a diameter of approximately 1 micron. The crystals are packed in a mold and subjected to a pressure of about 2000 psi which sets the crystals to the form of the mold, generally a disc or plate. This disc is then sintered by heating it to 1100° C for one hour to form a coherent mass. The disc is also inherently doped during sintering since the metal in the crystal partially vaporizes during heating and diffuses through the disc. A large amount of semiconductor may be produced by this process at a very low cost. The resulting semiconductor is diffusing to light and so is useful as the lower layer of a single cell 10 whereby the light impinges on the metal layer 18, and passes through the layer 16 to the layer 14. Light not absorbed in the layer 14 impinges onto the sintered semiconductor 12 and is scattered and reflected back to the layer 14 for absorption.

While an embodiment of the invention has been shown and described, further embodiments or combination of those described herein will be apparent to those skilled in the art without departing from the spirit of the invention. For example, in the array 24, more than one cell with the same dye for absorbing at the same wavelength, in addition to dyes that absorb at different wavelengths, may also be used to further scavenge energy from sunlight that impinges on the array 24 and is not absorbed by a previous cell.

What I claim is:

1. A Solar cell comprised of:
   a semiconductor formed to have two faces;
   an ohmic contact on one of said faces;
   a sensitizer layer on the other of said semiconductor faces, said sensitizer layer having a ground state within the bandgap of the semiconductor and a first excited state above the conduction band edge of the semiconductor;
   a reducing agent layer over said sensitizer layer, said reducing agent having a ground state that is above the ground state of said sensitizer layer; and a metal layer over said reducing agent layer.

2. The solar cell of claim 1, wherein said semiconductor is virtually transparent to the solar spectrum.

3. The solar cell of claim 1, wherein said semiconductor is titanium dioxide.

4. The solar cell of claim 1, wherein said semiconductor is comprised of sintered microcrystals.

5. The solar cell of claim 1, wherein said sensitizer layer is an organic dye.

6. The solar cell of claim 1, wherein said sensitizer layer is a cyanine dye.

7. The solar cell of claim 1, wherein said reducing agent layer is hydroquinone.

8. The solar cell of claim 1, further including a plurality of said cells stacked one on top of another, the ohmic contact, the reducing agent layer, the metal layer and the semiconductor of each cell being virtually transparent to impinging solar light, the sensitizer layers in a plurality of said cells being absorbent of different wavelength bands of solar light.

* * * * *